(12) United States Patent
Fox et al.

(10) Patent No.: US 7,406,403 B2
(45) Date of Patent: Jul. 29, 2008

(54) SYSTEMS AND METHODS FOR AUTOMATICALLY GENERATING 3D WIREFRAME CAD MODELS OF AIRCRAFT

(75) Inventors: Michael K. Fox, Seattle, WA (US); Michael D. Galuska, Kirkland, WA (US); Brian H. Seong, Woodinville, WA (US)

(73) Assignee: The Boeing Company, Chicago, IL (US)

( * ) Notice: Subject to any disclaimer, the term of this patent is extended or adjusted under 35 U.S.C. 154(b) by 628 days.

(21) Appl. No.: 10/847,715

(22) Filed: May 18, 2004

(65) Prior Publication Data

US 2005/0091010 A1    Apr. 28, 2005

(51) Int. Cl.
*G06F 17/50* (2006.01)
*G06F 19/00* (2006.01)

(52) U.S. Cl. .............................. 703/1; 700/97; 700/98; 700/182

(58) Field of Classification Search ...................... 703/1; 700/97, 98, 182, 82; 434/372; 345/664; 702/144
See application file for complete search history.

(56) References Cited

U.S. PATENT DOCUMENTS

| | | | | |
|---|---|---|---|---|
| 5,038,291 | A * | 8/1991 | Wang et al. | 700/98 |
| 5,243,665 | A * | 9/1993 | Maney et al. | 382/152 |
| 6,190,484 | B1 * | 2/2001 | Appa | 156/189 |
| 6,445,390 | B1 | 9/2002 | Aftosmis et al. | |
| 6,486,878 | B1 * | 11/2002 | Subrahmanyam et al. | 345/420 |

OTHER PUBLICATIONS

Robert E. Phillips, "Dynamic Objects for Engineering Automation" Communications of the ACM, May 1997, pp. 59-65.*
Sang Hun Lee, Kunwoo Lee, "Partial Entity Structure: A Compact Non-Manifold Boundary Representation Based on Partial Topological Entities", ACM 2001 1-58113-366-Sep. 1, 2006, pp. 159-170.*
Trapp JC, Sobieczky H.; Interactive Parametric Geometry Design; AIAA Aerospace Sciences Meeting and Exhibit; Jan. 11, 1999; pp. 1-10.
Barger R.L., Adams M.S.; Automatic Procedures for Computing Complete Configuration Geometry From Individual Component Descriptions; NASA Technical Memorandum; [Online] Jul. 1994: pp. 1-11.

(Continued)

*Primary Examiner*—Paul L Rodriguez
*Assistant Examiner*—Dwin M Craig
(74) *Attorney, Agent, or Firm*—Lee & Hayes, PLLC (57) ABSTRACT

Computer-based systems, methods, and computer-program products for automatically creating three dimensional geometric models are provided. The geometric models may be used to generate finite element models for computer modeling and loads testing. Automatically creating geometric models includes generating a surface curve based on surface and parameter information at all frame locations. Stringer points are automatically spaced on the first generated surface curve based on the parameter information. The stringer seed points are then propagated to the other frame curves based on parameter information. A stringer curve is automatically generated for each set of corresponding stringer points. The generated stringer curves are automatically projected onto the surface. All points, projected curves, lines and ribbon surfaces are named according to a naming convention established by the user to facilitate the automatic importation of the CAD elements into a FEM preprocessor program.

26 Claims, 6 Drawing Sheets

OTHER PUBLICATIONS

Wang Zijum; Geometric Trimming and Curvature Continuous Surface Blending for Aircraft Fuselage land Wing Shapes; [Online] Feb. 16, 2001.

Grandine Thomas A.; Applications of Contouring; SIAM Review Jun. 2000 SOC for Industrial & Applied Mathematics Publ.; Philadelphia, [online]PA; vol. 42.

* cited by examiner

SYSTEMS AND METHODS FOR AUTOMATICALLY GENERATING 3D WIREFRAME CAD MODELS OF AIRCRAFT

FIELD OF THE INVENTION

This invention relates generally to computer modeling and, more specifically, to automated computer modeling.

BACKGROUND OF THE INVENTION

Computer models for analyzing three-dimensional structures may take a great amount of time and money to produce. For example, a Computer Aided Design (CAD) representation of an airplane typically includes simple lines and curves representing the centerline of each primary structural element of the airplane. Manually creating such a model is slow and often repetitive, tedious work.

When a new airplane or airplane derivative concept is proposed, by engineers in the Configuration engineers, it is presented to the other engineering disciplines (e.g. Structures, Aerodynamics, Loads, Weights) as a Configuration Memo. At the same time the Configuration engineers may release a very simplified CAD model based on the Configuration Memo. This Configuration CAD model consists of two dimensional elements, with the fuselage elements on one plane and the wing elements on another. Whether this Configuration CAD model is supplied or not, the data from the Configuration engineers is generally insufficient for downstream analysis, such as Finite Element Modeling (FEM) of the airplane, and is typically slowly enhanced by addition of structural elements generated in manual CAD layouts. The development of the CAD elements, specifically a 3D "wireframe" model, may take many man-hours using existing CAD systems. The term "wireframe" means three dimensional (i.e. drawn in three dimensional space, not on a single plane) lines, points and curves that represent the centerlines of structural members Typically the CAD model describing the overall airplane configuration is put together from separate CAD models created piecemeal by engineers who design their portion of the structure after coordination with the engineers designing the adjoining structure. Many times, however, the resultant overall CAD model contains inadvertently non-contiguous or redundant CAD elements. Such elements create problems during computerized analysis such as FEM. To solve these problems, the analyst must coordinate with the many engineers who contributed to the overall CAD model, resulting in a lot of time-consuming work to repair the model. Therefore, there exists an unmet need to quickly and easily create 3D wireframe CAD models.

SUMMARY

An embodiment of the present invention provides computer-based systems, methods, and computer-program products for automatically creating 3D wireframe CAD models of aircraft. It assumes that the aircraft fuselage will follow the nearly universal structural paradigm of a thin-walled pressure vessel stiffened with radial frames and longitudinal stringers. It assumes that the aircraft wing will follow the nearly universal structural paradigm of a thin-walled wing box stiffened with inboard-to-outboard spars and forward-to-aft ribs. The 3D wireframe CAD models may be used to generate finite element models for computer modeling and loads testing and also may be used as reference data from which final CAD definition of structural parts will be created.

In accordance with further aspects of the invention, automatically creating 3D wireframe CAD models includes generating CAD curves that represent the fuselage frames and stringers and the wing spars and ribs (and other major structural members). These curves are created on CAD surfaces (known as lofts) that represent the proposed outer surface of the aircraft. The curves are generated based on parameters input by the user (representing aircraft attributes that are volatile) and by encoded rules that represent less volatile aircraft attributes.

Fuselage frame centerline curve locations may be rule-based or may be input from the simple Configuration CAD model. In either case this invention represents them using planar curves made by "cutting" the fuselage loft with a CAD plane.

Fuselage stringer spacing may be rule-based or may be input from a separate CAD model generated by a Structures engineer. This model generally consists of a single frame curve (see preceding paragraph) at some appropriate location along the length of the fuselage, which curve will CAD points spaced along it. In either case, creation of stringer centerline curves starts from these "seed points" on the cross-sectional curve. If the spacing is rule-based this invention creates the primary frame curve then spaces the seed points according to rules and certain parameters input by the user. These seed points are then propagated from the initial cross-sectional curve to all the curves (both forward and aft of the initial curve) that have been created at all the frame locations. Propagation is done in one of two ways, and is decided according to input from the user. Points are either propagated on a constant "water line" (i.e. a horizontal plane) or they are projected normal to the frame curve onto which they are being propagated. Points that are propagated via projection result in stringer curves that follow the contour of the fuselage as it's diameter changes. This is generally the most common method of projection. When the user specifies propagation type for a seed point he may also specify a range (along the airplanes longitudinal axis) outside of which the propagation type applies. For example, the stringer corresponding to the passenger door sill may be propagated on a constant water line between the foremost and aftmost doors and may be projected outside of that range. Regardless of propagation type, each seed point is used to create a family of points along the entire length of the fuselage. After all the points have been propagated this invention creates a CAD spline through each family of points. Each spline represents the centerline curve of a stringer. These curves are not necessarily entirely on the loft except at the propagated points. Therefore this invention projects each spline onto the loft.

This invention also creates 3D elements representing the fuselage floor beams in the passenger and cargo compartments and representing the cargo stanchions.

The locations of the upper surface of the floors are taken from the Configuration CAD model or may be created from the data in a Config Memo. This invention creates CAD planes to represent the upper surfaces of all floors, which may be horizontal or may slope forward to aft. These planes are intersected with each of the frame location planes to create lines, representing the floor beams, at every frame location.

The location of cargo stanchions is rule-based or may be entered as a parameter by the user. Stanchions, if present, are represented by a single vertical centerline and will be created at every frame location.

This invention gives each 3D wireframe element a name attribute according to an agreed upon naming convention. These names are used by downstream applications that used the CAD elements created by this invention. The user is relieved of the tedious burden of interactively propagating the seed points hundreds of times, creating splines through the points and accurately typing the names for all these hundreds of elements.

This invention also creates 3D elements representing wing structural members.

Wing spar centerline curve locations are taken from the wing reference plane in the Configuration CAD model or may be created from the data in the Config Memo. They are projected onto the wing lofts.

Wing rib centerline curve locations may be rule-based or may be input from the Configuration CAD model. If they are rule-based the user may choose to specify their orientation with respect to the spars. They are created on the wing reference plane and projected onto the wing lofts.

Wing stringer centerline curves are created according to spacing parameters input by the user, who may also specify their orientation with respect to the spars. These curves are automatically terminated where they intersect with spars. They are created on the wing reference plane and are projected onto the wing lofts. If available, access hatch cutouts may be input from a CAD layout and the stringer curves may be split where they intersect with these cutouts. At the user's discretion, this invention will create intersection points on the loft wherever the stringers, ribs and spars intersect.

At the user's choice, this invention may also create CAD "ribbon surfaces" along either wing or fuselage stringer centerline curves. These are normal to the loft along the centerline curves and extend a short distance (typically an inch) on the inside and outside of the loft.

As with the fuselage, this invention gives each 3D wireframe element a name attribute according to an agreed upon naming convention. These names are used by downstream applications that use the CAD elements created by this invention. The user is relieved of the tedious burden of interactively laying out the centerlines, projecting them onto the lofts, generating intersection points and ribbon surfaces and accurately typing the names for all these hundreds of elements.

BRIEF DESCRIPTION OF THE DRAWINGS

The preferred and alternative embodiments of the present invention are described in detail below with reference to the following drawings.

DETAILED DESCRIPTION OF THE INVENTION

The present invention relates to computer-based systems, methods, and computer-program products for automatically creating 3D wireframe CAD models. Many specific details of certain embodiments of the invention are set forth in the following description and in FIGS. 1-10 to provide a thorough understanding of such embodiments. One skilled in the art, however, will understand that the present invention may have additional embodiments, or that the present invention may be practiced without several of the details described in the following description.

An embodiment of the present invention is a process suitably implemented in software for automatically generating 3D wireframe CAD models on a stand-alone computer, or a computer coupled to other computers or computer systems over a network.

Figure 1:
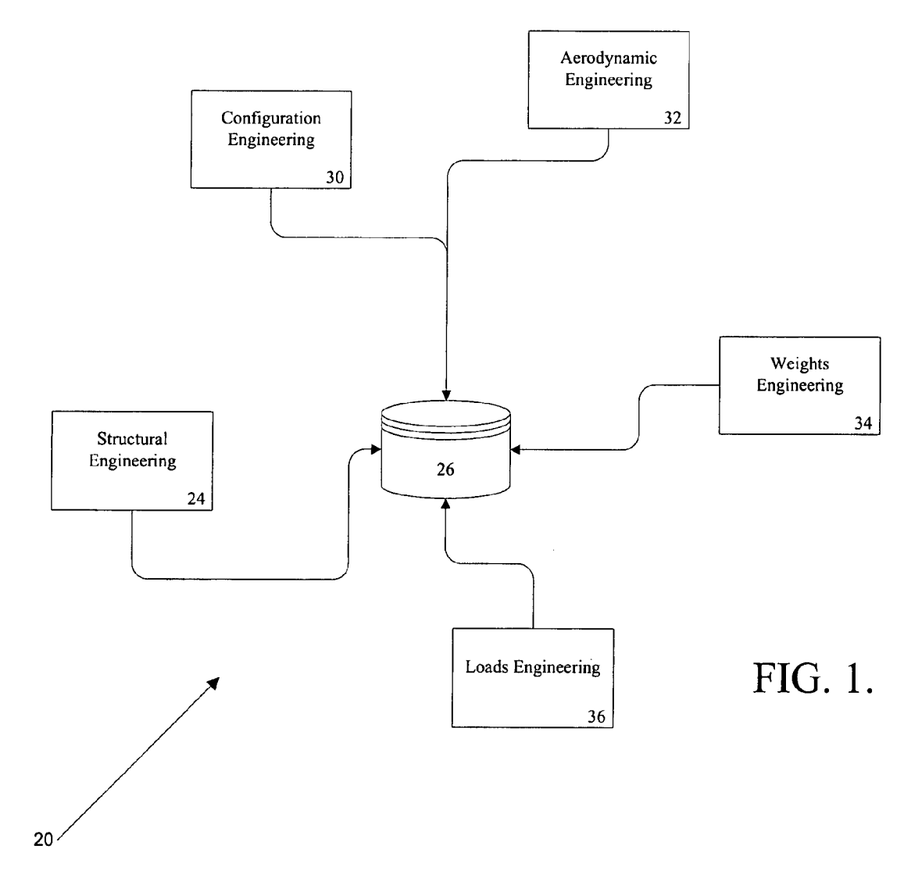
FIG. 1 illustrates an exemplary system formed in accordance with an embodiment of the present invention.

Referring to FIG. 1, an embodiment of the present invention is implemented in a network-based system 20 that includes a structures group 24 coupled to a database 26, a Configurations group 30, an Aerodynamics/Loft group 32, a Weights group 34, and a Loads group 36, over a public or private data network. The network-based system 20 is an exemplary system used in aircraft manufacturing, but could be altered for various other manufacturing or product analysis applications where 3D wireframe elements are needed for analysis, such as Finite Element Modeling (FEM). Each of the groups 24, 30, 32, 34 and 36 may include general-purpose digital computers that execute software for operating on or generating a particular portion of a computer model, such as an airplane computer model, and saving the model in the database 26 to allow all the groups to have access. The model may be stored on removable memory devices or at memory devices associated with any of the groups 24, 30, 32, 34 and 36.

Figure 2:
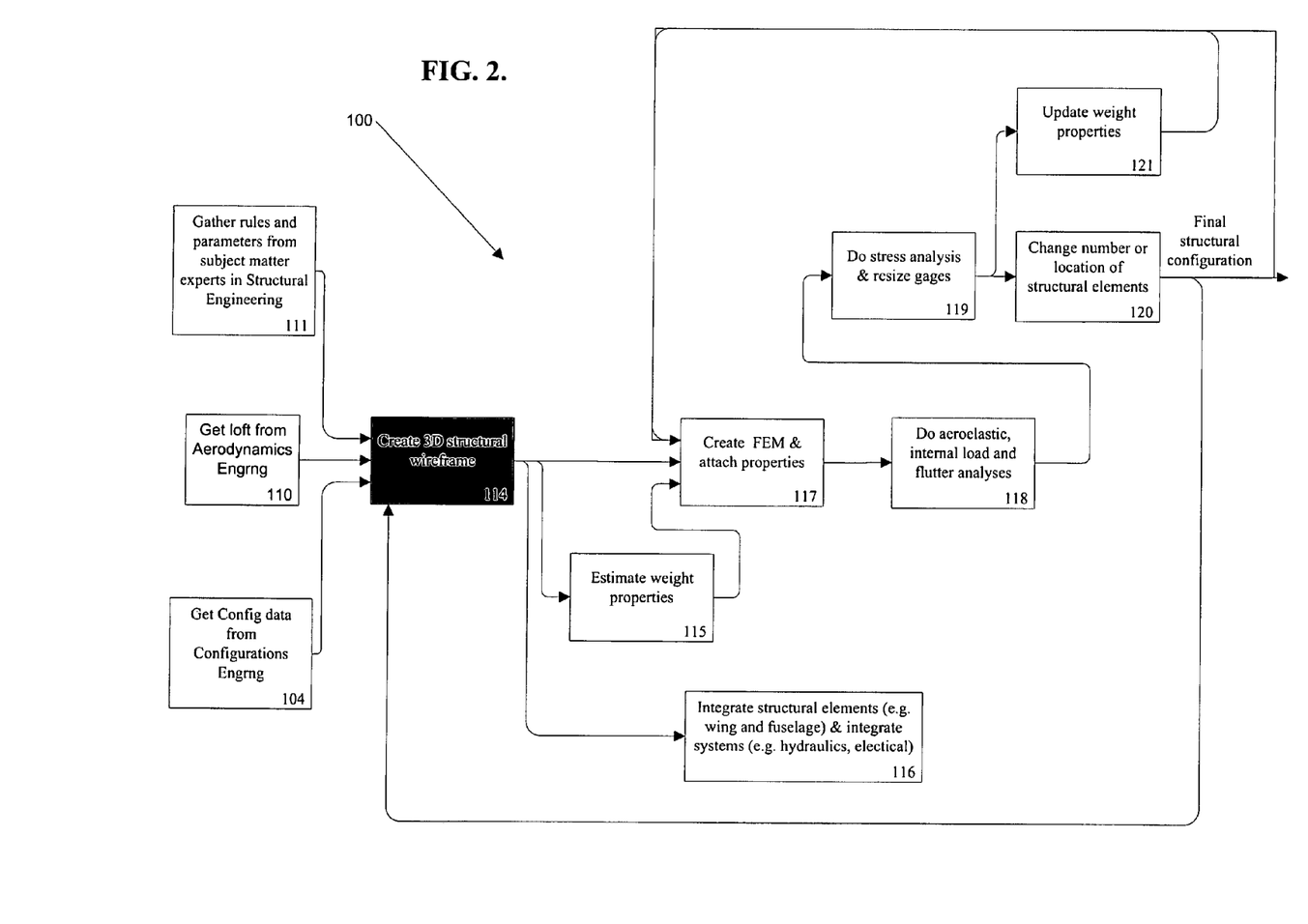
FIG. 2 shows an exemplary process performed by the system shown in FIG. 1.

Referring now to FIG. 2, an exemplary aircraft model generation process 100 performed by the system 20 is shown. The process 100 begins at a block 104 where configuration data is gathered from the Configuration engineers. At a block 110 the CAD surfaces (lofts) are obtained from the Aerodynamics engineers. At a block 111 some rules, and parameter information are gathered from subject matter experts amongst the Structural Engineering community. At a block 114, a this invention is used to generate 3D wireframe elements based on the parameter, rules, and loft information. In one embodiment, the—interactive application (this invention) runs on a computer of the structures group 24. This invention interacts directly with a CAD system such as CATIA® in order to create a CAD model. At a block 115 the wireframe is used by Weights engineers to estimate weight properties of the aircraft. At a block 116 the 3D wireframe is used by Structural Engineers to integrate various structural elements. The wireframe generated by this invention help the engineers visualize some of the areas where work will be required to achieve integration of various structural elements, for instance between wing structure and fuselage structure. The wireframe will also be used by Electrical, Hydraulics and Environmental Control engineers to visualize the structure within which their respective hardware must fit and be attached At a block 117, some Finite Element Models (FEMs) are created based on the generated 3D wireframe elements. At a block 118, the FEM is used to perform aeroelastic, internal load and flutter analyses. At a block 119 the stiffness requirements output by the internal loads analysis are used by Structural engineers to do stress analysis and to resize the structure. At a block 120 the new sizing requirements sometimes drive the Structural engineers to change the number or locations of some structural elements. These changes may be fed back to the rules or parameters input to this invention and it may be reexecuted. At a block 121 the sizing requirements from the do stress analysis are used by Weights engineers to update their estimates of the weight properties. These changes are fed back into the internal loads FEM. The process 100 continues until the airplane design meets particular pre-defined requirements (e.g. range, payload, speed, structural integrity).

It will be appreciated that, in alternate embodiments, the loft and parameter information can be manually retrieved from the database 26, or automatically received directly from the Structural engineers 24, the Configuration engineers 30 and the Aerodynamics Engineers 32, or electronically from the groups 24, 30 and 32 over the network 40.

Figure 3:
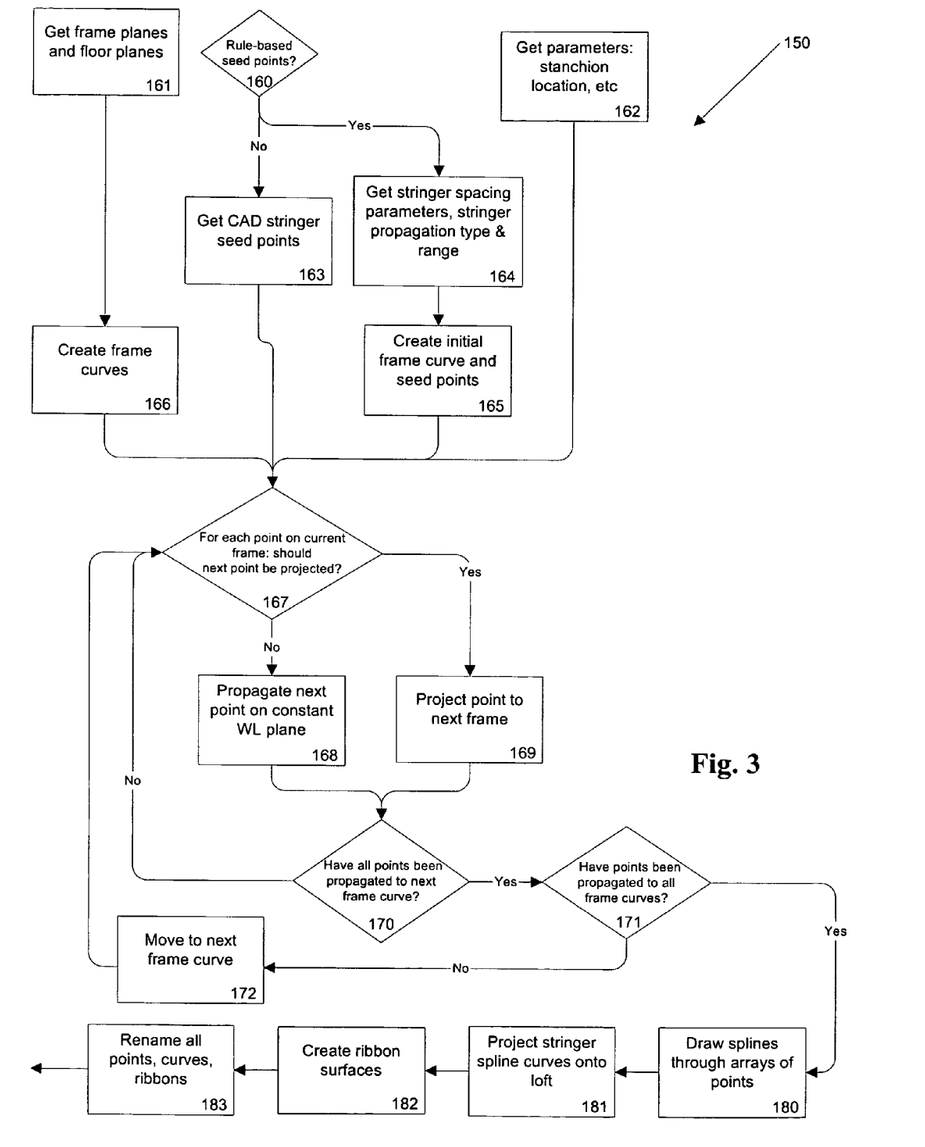
FIGS. 3 and 4 show an exemplary process performed by a component of the system shown in FIG. 2.

Referring to FIG. 3, a process 150 (the block 114, FIG. 2) in accordance with an embodiment of the invention begins at a block 160 where the user is asked by this invention whether he wants rule-based stringer spacing or instead wants to provide a CAD model of the seed points. The CAD model is read in a block 163 if required. At a block 161 this invention gathers frame plane data from the Configuration CAD model. At a block 162 the user is asked to input parameters relating that will be required regardless of the origin of the seed points. At a block 164 the user is asked to input parameters about stringer spacing and propagation types if the spacing will be rule-based. (When seed points are entered via a CAD model, their propagation types are communicated by the points' layer attribute.) At a block 165 a primary frame curve is created near the longitudinal center of the airplane and then "seed points" are space along this curve according to rules and certain parameters input by the user. These seed points represent the locations of the stringer cross-sectional centers. The user may specify, for each seed point, whether the stringer curve made from it should be remain on a constant "waterline," (that is, a constant horizontal plane) or should follow the contour of the fuselage loft. The user may also specify a range within which the curve will remain on a constant waterline, and outside of which it will start to follow the contour. Each seed point is represented in this invention by a data structure that stores the type (waterline or contour) and range. Each point propagated from a seed point inherits the data from its seed point. At a block 166 the remainder of the frame curves is created, both forward and aft of the primary frame curve. At a block 167, each seed point is queried for its type and range and a decision is made about how it should be propagated. At a block 168 a point that is within the range for which it should remain on a constant waterline will be propagated to the next frame curve where that curve is intersected by a waterline plane. At a block 169 a point that is within the range for which it should follow the contour will be propagated to the next frame curve by projecting normal to that curve. An array of points is built for all the points that are propagated from each seed point. Each array will later be used to create a stringer curve. At a decision block 170 this invention checks whether all the points on the current frame curve have been propagated to the next frame. If not, this invention returns to block 167 and propagates the next point. If all points on the current frame have been propagated this invention checks, at a decision block 171, whether any more frame curves exist, to which the points must be propagated further. If so, at a block 172 this invention moves to next frame curve (to which the points have just been propagated) and propagates them again (at block 167) to the next curve. If, at decision block 171, no further frame curves exist (forward or aft of the primary frame curve) then at a block 180 all the arrays of points are processed and a spline is drawn through the points in each array. These splines will touch the loft at the points but may not touch between points. Therefore, at a block 181 this invention makes a new curve from each of the splines by projecting the splines onto the loft. At a block 182 "ribbon surfaces" are created from the projected curves. These are normal to the loft along the projected curves and extend a short distance (typically an inch) on the inside and outside of the loft. At a block 183 each point, projected curve and ribbon surface is named according to a naming convention established by the user.

Figure 4:
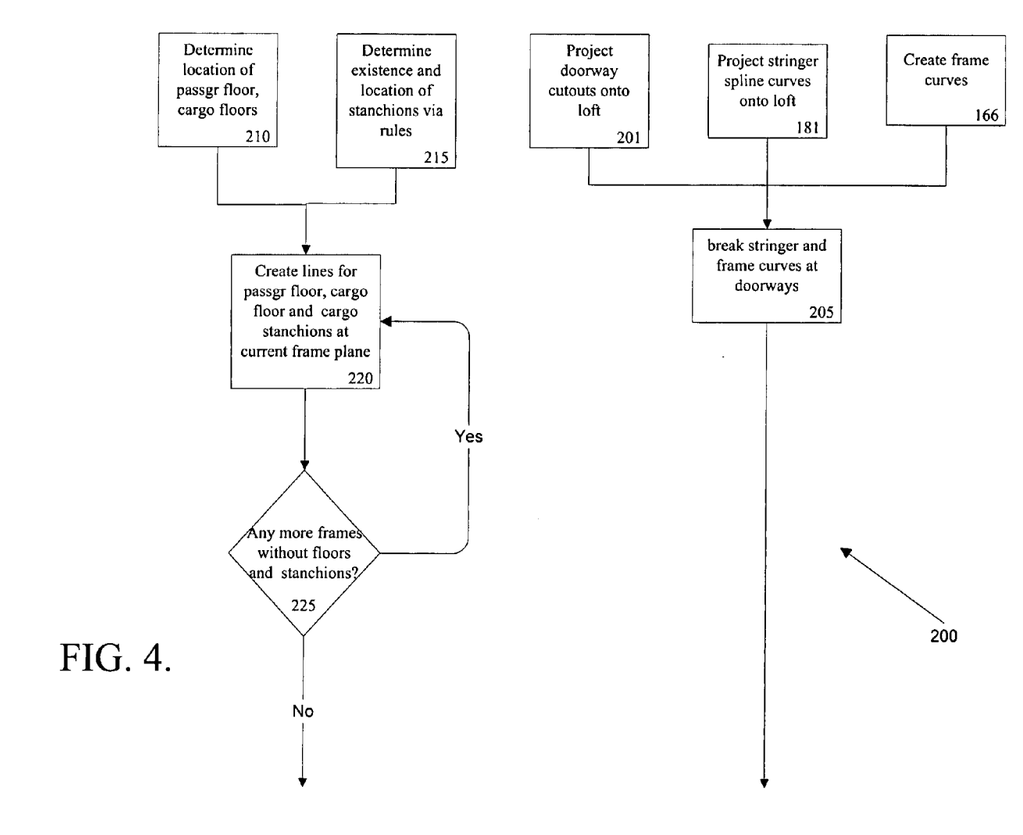

FIG. 4 (another part of the block 114, FIG. 2) illustrates additional processing of the data in a process 200. This additional processing is done at the user's discretion, depending on the way he will be using the CAD elements that are being created. For instance, if the wireframe elements are to be used in a simple external loads Finite Element Model, then the additional processing probably will not be done since these FEMs typically do not model details such as doorways, and floors.

The branch on the right side of FIG. 4 provides optional additional processing of the stringer and frame curves output at the bottom of FIG. 3 (breaking them at the doorways). The branch on the left side of FIG. 4 adds optional additional elements (the floor and stanchion lines).

So the final output of CAD elements might be:
1) only the elements from FIG. 3 or
2) the elements from the right side of FIG. 4 or
3) the elements from FIG. 3 and the left side of FIG. 4 or
4) the elements from the right side of FIG. 4 and the left side of FIG. 4

A customer using the output to create a simple External Loads model would generally employ option 1. A customer using the output to create a more complex Internal Loads model would generally employ option 4. A customer from Structural Engineering, using the output to create stringers would generally employ option 2.

The additional processing begins with the frame curves from the block 166, FIG. 3 and the stringer curves from the block 181, FIG. 3. At a block 201 the doorway curves, obtained as 2-dimensional curves from the Configuration CAD model, are projected onto the fuselage loft. At a block 205 the stringer curves and the frame curves are broken where they intersect the doorway curves. At a block 210 the locations of the passenger floor, and the cargo floor are determined from the Configuration CAD model and CAD planes are created to represent the locations of those floors. At block 215, the existence and, if applicable, the locations of cargo stanchions are determined via rules and user input about the airplane and CAD planes are created to represent the locations of those stanchions. At a block 220 lines are created at a frame location (i.e. on the same plane in space as a frame curve) to represent the passenger floor beams, the cargo floor beams and the cargo stanchions at the current frame. The lines are created by intersecting CAD planes that represent the beams with the plane of the frame curve, then trimming the lines as appropriate. When these lines have been created this invention checks, at a decision block 225, whether any more frames without floors and stanchions exist. If so, the flow returns to block 220 and creates lines at the next frame location.

Figure 5:
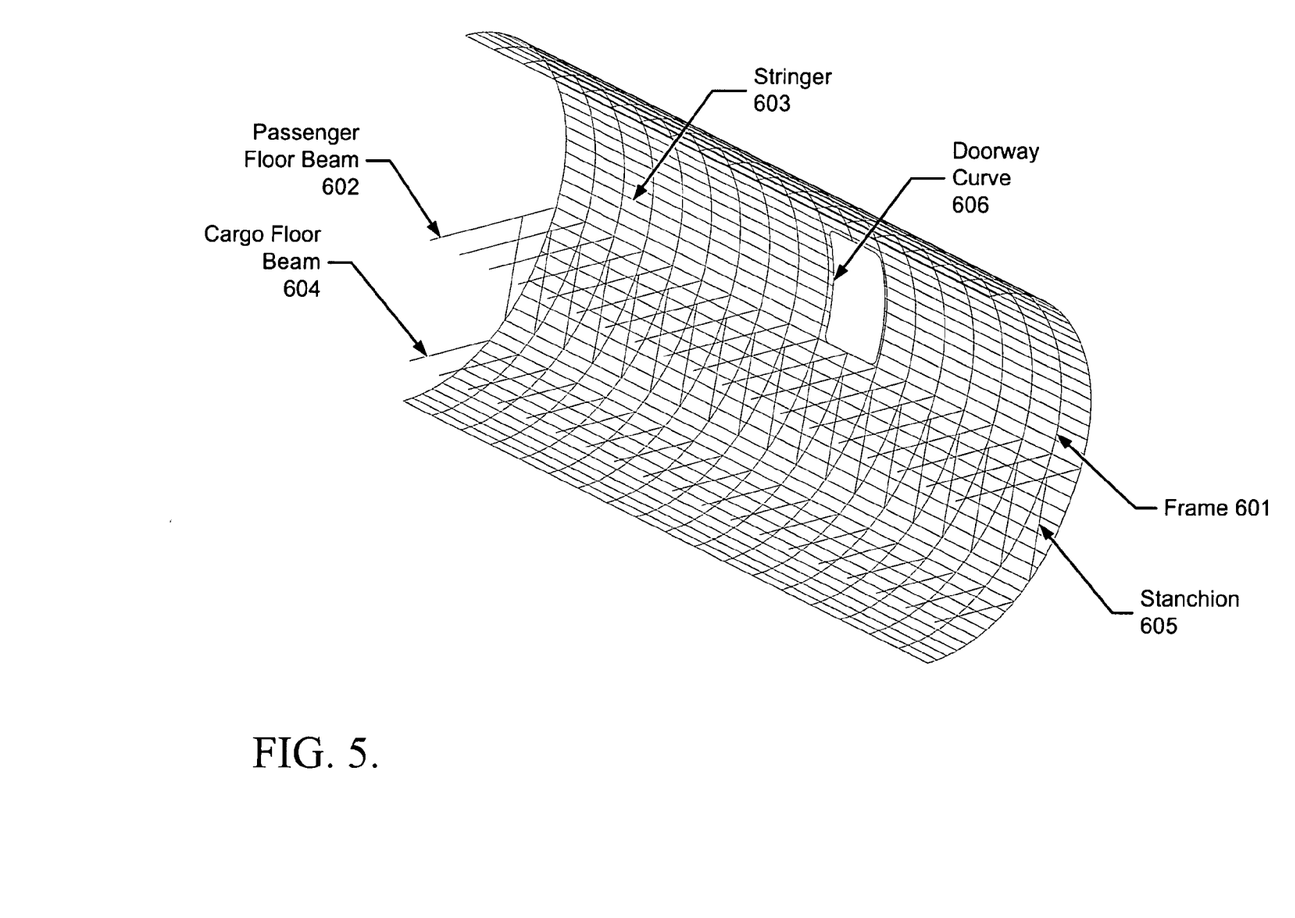
FIG. 5 illustrates a portion of an exemplary geometric computer-model generated by the system shown in FIGS. 3 and 4.

In one embodiment, a 3D wireframe elements are created for a symmetrical system, therefore only half of the system is initially generate, such as the aircraft section 340 shown in FIG. 5. The example 3D wireframe aircraft section 340 includes frames (601), stringers (603), passenger floor beams (602), cargo floor beams (604), stanchions (605) and doorway curves (606).

Figure 6:
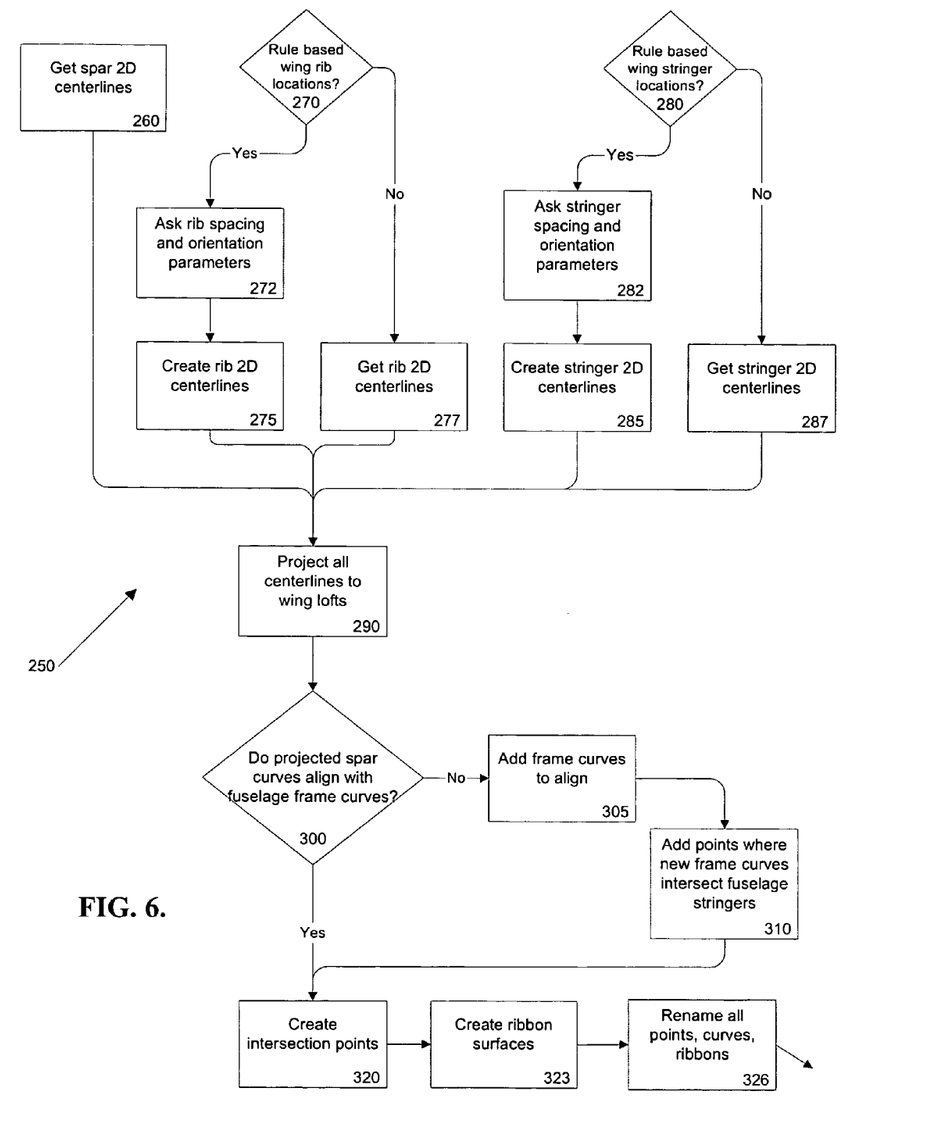
FIG. 6 shows an exemplary process performed by a component of the system shown in FIG. 2

Referring to FIG. 6, a process 250 (the block 114, FIG. 2) is employed, in accordance with an embodiment of the invention, to create 3D elements representing wing structural members. That process begins at blocks 260 where the wing spar 2D centerlines are gathered from the Configuration CAD model or may be created from the data in a Configuration (Config) Memo. These lines are on the Wing Reference Plane, which is also gathered from the Configuration CAD model.

At a decision block 270, the user is asked by this invention whether wing rib 2D centerlines are available on the Wing Reference Plane. If not, the user will be asked, at a block 272 to input parameters about the spacing of the ribs and their orientation with respect to the spars and the wing rib centerlines will be created on the Wing Reference Plane by this invention, according to rules, at a block 275. These lines are automatically terminated, according to rules, where they intersect with spars. If the rib centerlines are already available on the Wing Reference Plane they will be gathered from the Configuration CAD model at a block 277.

At a decision block 280, the user is asked by this invention whether wing stringer centerlines are available on the Wing Reference Plane. If not, the user will be asked, at a block 282 to input parameters about the spacing of the stringers and their orientation with respect to the spars and the wing stringer centerlines will be created on the Wing Reference Plane by this invention, according to rules, at a block 285. These lines are automatically terminated, according to rules, where they intersect with spars and ribs. If the stringer centerlines are already available on the Wing Reference Plane they will be gathered from the Configuration CAD model at a block 287.

At a block 290 the wing spars, ribs and stringers are all projected from the Wing Reference Plane onto the upper and lower wing lofts.

At a block 300 the projected spar curves are checked to see if their inboard ends align with (i.e. intersect) a fuselage frame curve. Quite commonly, spar centerlines laid out on the Wing Reference Plane with the intention that they intersect a fuselage frame curve are found to not quite intersect after they are projected onto the wing lofts. Even a small discontiguity between the spar and fuselage frame elements can cause anomalous results when these wireframe elements are used to generate a FEM model. Therefore, at a block 305 the user may choose to add additional fuselage frame curves that align with the inboard ends of the spar curves. Then, at a block 310, the new frame curves may be intersected (at the user's discretion) with all the fuselage stringers (created previously per process 150) and point elements will be added at all the intersections.

At a block 320, this invention will create intersection points (at the user's discretion) wherever the wing stringers, wing ribs and wing spars intersect.

At a block 323, this invention will (at the user's discretion) create CAD "ribbon surfaces" along the wing stringer centerline curves. These are normal to the loft along the centerline curves and extend a short distance (typically an inch) on the inside and outside of the loft.

At a block 326 this invention gives each 3D wireframe element a name attribute according to an agreed upon naming convention. These names are used by downstream applications that use the CAD elements created by this invention. The user is relieved of the tedious burden of interactively laying out the centerlines, projecting them onto the lofts, generating intersection points and ribbon surfaces and accurately typing the names for all these hundreds of elements.

In another embodiment, the interactive application includes a software component (not shown) includes a repair module for repairing 3D wireframe elements. The repair module uses a hierarchy of predefined rules (e.g. all ribs should terminate at spars) to check that the geometric components of the 3D wireframe model intersect appropriately. When a rule is violated, the components are extended, moved, or truncated as necessary.

While preferred and alternate embodiments of the invention have been illustrated and described, as noted above, many changes can be made without departing from the spirit and scope of the invention. Accordingly, the scope of the invention is not limited by the disclosure of the preferred and alternate embodiments. Instead, the invention should be determined entirely by reference to the claims that follow.

What is claimed is:

1. A method comprising:
   receiving previously defined computer model and parameter information, wherein the computer model includes at least one surface and the parameter information includes loft surface information;
   automatically positioning a plurality of 3D wireframe CAD frame curves on the computer model based on the parameter information;
   automatically positioning a plurality of 3D wireframe CAD stringer curves on the computer model based on the parameter information;
   receiving wing spar centerline information;
   projecting wing spar centerlines to a predefined wing loft;
   adding one or more additional frame curves, if one or more of the projected wing spar centerlines fails to align with one or more of the frame curves; and
   storing the positioned frame curves and stringer curves in a computer-readable medium.

2. The method of claim 1, further comprising:
   automatically breaking the frame and stringer curves when the frame and stringer curves intersect at doorway curves.

3. The method of claim 1, wherein automatically positioning a plurality of frame curves includes:
   a) determining a frame plane based on the parameter information;
   b) generating a frame curve by intersecting the determined frame plane with the at least one surface based on the loft surface information; and
   c) if not all the frame planes have been analyzed, determining a next frame plane and returning to step b).

4. The method of claim 1, further comprising:
   setting wing rib location information and wing stringer location information;
   creating one or more wing rib centerlines based on the set wing rib location information;
   creating one or more wing stringer centerlines based on the set wing stringer location information; and
   projecting the wing rib and the wine spar centerlines to a predefined wing loft.

5. The method of claim 4, further comprising:
   creating intersection points where the wing spar centerlines intersect with the frame curves;
   creating ribbon surfaces based on the wing stringer centerline curves and the wing surface information; and
   automatically renaming all the intersection points, curves, and ribbon surfaces according to a naming convention.

6. The method of claim 2, wherein automatically positioning a plurality of stringer curves includes:
   a) automatically spacing stringer seed points on a first frame curve based on rules and the parameter information;
   b) propagating the seed points to additional frame curves based on parameter information, and repeating until all previously defined frame locations have been analyzed;
   c) automatically generating a stringer spline curve through each set of corresponding stringer points;
   d) automatically projecting all the spline curves onto a previously defined fuselage loft surface;
   e) automatically creating ribbon surfaces based on the stringer curves and fuselage surface information; and f) automatically renaming all the points, curves, and ribbon surfaces according to a naming convention.

7. The method of claim 6, wherein automatically generating a 3D wireframe CAD computer model further includes:
automatically creating floor beams; and
automatically creating stanchions.

8. The method of claim 7, wherein automatically creating floor beams includes:
 i) determining a passenger floor plane, based on the parameter information;
 ii) generating a floor beam line by intersecting the determined passenger floor plane with the plane of the current frame curve and trimming the line based on an intersection with the frame curve;
 iii) if not all the frame planes have been analyzed, proceeding to a next frame plane and returning to step i); and
 iv) renaming all the floor beam lines according to a naming convention.

9. The method of claim 7, wherein automatically creating floor beams includes:
 i) determining a cargo floor plane based on the parameter information;
 ii) generating a floor beam line by intersecting the determined cargo floor plane with the plane of the current frame curve and trimming the line based on an intersection with the frame curve;
 iii) if not all the frame planes have been analyzed, proceeding to a next frame plane and returning to step ii); and
 iv) renaming all the floor beam lines according to a naming convention.

10. The method of claim 7, wherein automatically creating stanchions includes:
 i) determining a stanchion plane based on rules and the parameter information;
 ii) generating a stanchion line by intersecting the determined stanchion plane with the plane of the current frame curve and trimming the line based on an intersection with the frame curve at a first end and the floor beam line at a second end;
 iii) if not all the frame planes have been analyzed, proceeding to a next frame plane and returning to step v); and
 iv) renaming all the floor beam lines according to a naming convention.

11. The method of claim 1, wherein the 3D wireframe computer model includes a model of at least a portion of an airplane.

12. An apparatus comprising:
means for receiving previously defined computer model surface and parameter information;
means for automatically generating a 3D wireframe CAD computer model based on the received surface and parameter information, wherein the means for automatically generating a 3D wireframe CAD computer model includes:
 a means for generating one or more frame curves based on the surface information and the frame locations as parameter information;
 means for receiving wing spar centerline information;
 means for projecting wing spar centerlines to a predefined wing loft;
 means for adding one or more additional frame curves, if one or more of the projected wing spar centerlines fails to align with one or more of the frame curves; and
means for storing the generated CAD computer model.

13. The apparatus of claim 12, wherein the means for automatically generating a 3D wireframe CAD computer model further includes:
means for automatically spacing stringer points on each of the one or more generated frame curves based on the parameter information;
means for propagating the points to a next frame location if not all previously defined frame locations have been analyzed;
means for automatically generating a stringer curve for each set of corresponding stringer points;
means for automatically projecting a stringer curve onto a surface in a direction normal to the surface at all points along the curve;
means for automatically creating a ribbon surface based on a fuselage stringer curve and the fuselage surface information; and
means for automatically renaming all the points, curves, and ribbon surfaces according to a naming convention.

14. The apparatus of claim 12, wherein the means for generating one or more frame curves includes:
means for determining a frame plane based on the parameter information;
means for generating a frame curve by intersecting the determined frame plane with a three-dimensional surface based on the surface information; and
means for determining a next frame plane and returning to the means for generating a frame curve, if not all the frame planes have been analyzed.

15. The apparatus of claim 12, further comprising:
means for setting wing rib location information and wing stringer location information;
means for creating one or more wing rib centerlines based on the set wing rib location information;
means for creating one or more wing stringer centerlines based on the set wing stringer location information; and
means for projecting the wing rib and wing stringer centerlines to a predefined wing loft.

16. The apparatus of claim 15, further comprising:
means for creating intersection points where the wing spar centerlines intersect with the frame curves;
means for creating ribbon surfaces based on the wing stringer centerline curves and the wing surface information; and
means for automatically renaming all the intersection points, curves, and ribbon surfaces according to a naming convention.

17. The apparatus of claim 12, wherein the means for automatically creating floor beam and stanchion lines includes:
means for determining a plane based on rules and the parameter information; and
means for generating a line by intersecting the determined plane with the plane of the current frame curve and trimming the line as appropriate, based on an intersection with associated curves or lines.

18. A computer program product comprising computer readable medium, a plurality of components stored on the computer readable medium, wherein when the components are executed by a processor, performs the following functions:
a first component configured to receive previously defined computer model surface and parameter information;
a second component configured to process the surface and parameter information;
a third component configured to automatically generate a 3D wireframe CAD computer model based on the received surface and parameter information, wherein the third component includes:

a fourth component configured to position a plurality of frame curves, each surface curve generated based on the surface and the parameter information at a corresponding predefined frame location;

a fifth component configured to store the generated 3D wireframe CAD computer model; and a sixth component configured to name each point, projected curve, line, and ribbon surface according to a naming convention established by the user based on automatic importation of the CAD elements into a FEM preprocessor program for the creation of a finite element model.

19. The computer program product of claim 18, wherein the third component includes:

a seventh component configured to automatically space stringer points on the first generated frame curve based on the parameter information;

an eighth component configured to propagate the stringer points to the other frame curves;

a ninth component configured to automatically generate a stringer spline curve for each set of corresponding stringer points; and a tenth component configured to automatically project each of the spline curves onto the surface in a direction normal to the surface at all points along the curve.

20. The computer program product of claim 18, wherein the third component includes:

an eleventh component configured to determine all the frame planes based on the parameter information; and a twelfth component configured to generate frame curves by intersecting the determined frame planes with a three-dimensional surface based on the surface information.

21. The computer program product of claim 18, wherein the third component includes:

a thirteenth component component configured to determine the planes of the passenger floor, cargo floor and cargo stanchions; and a fourteenth component configured to generate lines representing the passenger floor beams, cargo floor beams and cargo stanchions by intersecting the determined plane with the plane of the current frame.

22. A computer program product comprising computer readable medium, a plurality of components stored on the computer readable medium, wherein when the components are executed by a processor, performs the following functions:

a first component configured to receive previously defined computer model surface and parameter information;

a second component configured to automatically generate a 3D wireframe CAD computer model based on the received surface and parameter information, wherein the means for automatically generating a 3D wireframe CAD computer model includes:

a third component configured to generate one or more frame curves based on the surface information and the frame locations as parameter information;

a fourth component configured to receive wing spar centerline information;

a fifth component configured to means to project wing spar centerlines to a predefined wing loft;

a sixth component configured to add one or more additional frame curves, if one or more of the projected wing spar centerlines fails to align with one or more of the frame curves; and a seventh component configured to store the generated CAD computer model.

23. The computer program product of claim 22, wherein the second component further includes:

a seventh component configured to automatically space stringer points on each of the one or more generated frame curves based on the parameter information;

an eighth component configured to propagate the points to a next frame location if not all previously defined frame locations have been analyzed;

a ninth component configured to automatically generate a stringer curve for each set of corresponding stringer points;

a tenth component configured to automatically project a stringer curve onto a surface in a direction normal to the surface at all points along the curve;

an eleventh component configured to automatically create a ribbon surface based on a fuselage stringer curve and the fuselage surface information; and a twelfth component configured to automatically rename all the points, curves, and ribbon surfaces according to a naming convention.

24. The computer program product of claim 22, wherein the means for generating one or more frame curves further includes:

a thirteenth component configured to determine a frame plane based on the parameter information;

a fourteenth component configured to generate a frame curve by intersecting the determined frame plane with a three-dimensional surface based on the surface information; and a fifteenth component configured to determine a next frame plane and returning to the means for generating a frame curve, if not all the frame planes have been analyzed.

25. The computer program product of claim 22, further comprising:

a sixteenth component configured to set wing rib location information and wing stringer location information;

a seventeenth component configured to create one or more wing rib centerlines based on the set wing rib location information;

an eighteenth component configured to create one or more wing stringer centerlines based on the set wing stringer location information; and a nineteenth component configured to project the wing rib and wing stringer centerlines to a predefined wing loft.

26. The computer program product of claim 25, further comprising:

a twentieth component configured to create intersection points where the wing spar centerlines intersect with the frame curves;

a twenty-first component configured to create ribbon surfaces based on the wing stringer centerline curves and the wing surface information; and a twenty-second component configured to automatically rename all the intersection points, curves, and ribbon surfaces according to a naming convention.

* * * * *